(12) United States Patent
Nagata

(10) Patent No.: US 6,507,084 B2
(45) Date of Patent: Jan. 14, 2003

(54) SEMICONDUCTOR LIGHT-RECEIVING ELEMENT

(75) Inventor: Hisao Nagata, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 0 days.

(21) Appl. No.: 09/880,298

(22) Filed: Jun. 13, 2001

(65) Prior Publication Data

US 2001/0052630 A1 Dec. 20, 2001

(30) Foreign Application Priority Data

Jun. 16, 2000 (JP) ......................................... 2000-181222

(51) Int. Cl.⁷ ............................................. H01L 31/075
(52) U.S. Cl. ........................... 257/458; 257/184; 438/48
(58) Field of Search ................................. 257/184–187, 257/436–438, 190, 466, 458, 459, 461, 452, 457; 438/48, 57, 63, 93, 94

(56) References Cited

U.S. PATENT DOCUMENTS 3,995,303 A * 11/1976 Nahory et al. ............... 136/262
5,365,087 A * 11/1994 Sasaki ........................ 257/184
5,444,274 A *  8/1995 Sasaki ........................ 257/184

FOREIGN PATENT DOCUMENTS

JP          405226686      *  9/1993   .................. 257/437

* cited by examiner

*Primary Examiner*—Hoai Ho
*Assistant Examiner*—Long K. Tran
(74) *Attorney, Agent, or Firm*—RatnerPrestia

(57) ABSTRACT

A semiconductor light-receiving element fabricated by using an impurity diffusion, in which a slow tail phenomenon caused in the processing of a digital signal may be suppressed. The semiconductor light-receiving element comprises a substrate including a first impurity diffused region, a first electrode provided on the bottom of the substrate, a second electrode provided on the first impurity diffused region, a second impurity diffused region provided so as to surround the first impurity diffused region with leaving a certain space therebetween, and a third electrode provided on the second impurity diffused region, wherein a reverse vias is applied to a PN junction formed by the substrate and the second impurity diffused region.

5 Claims, 6 Drawing Sheets

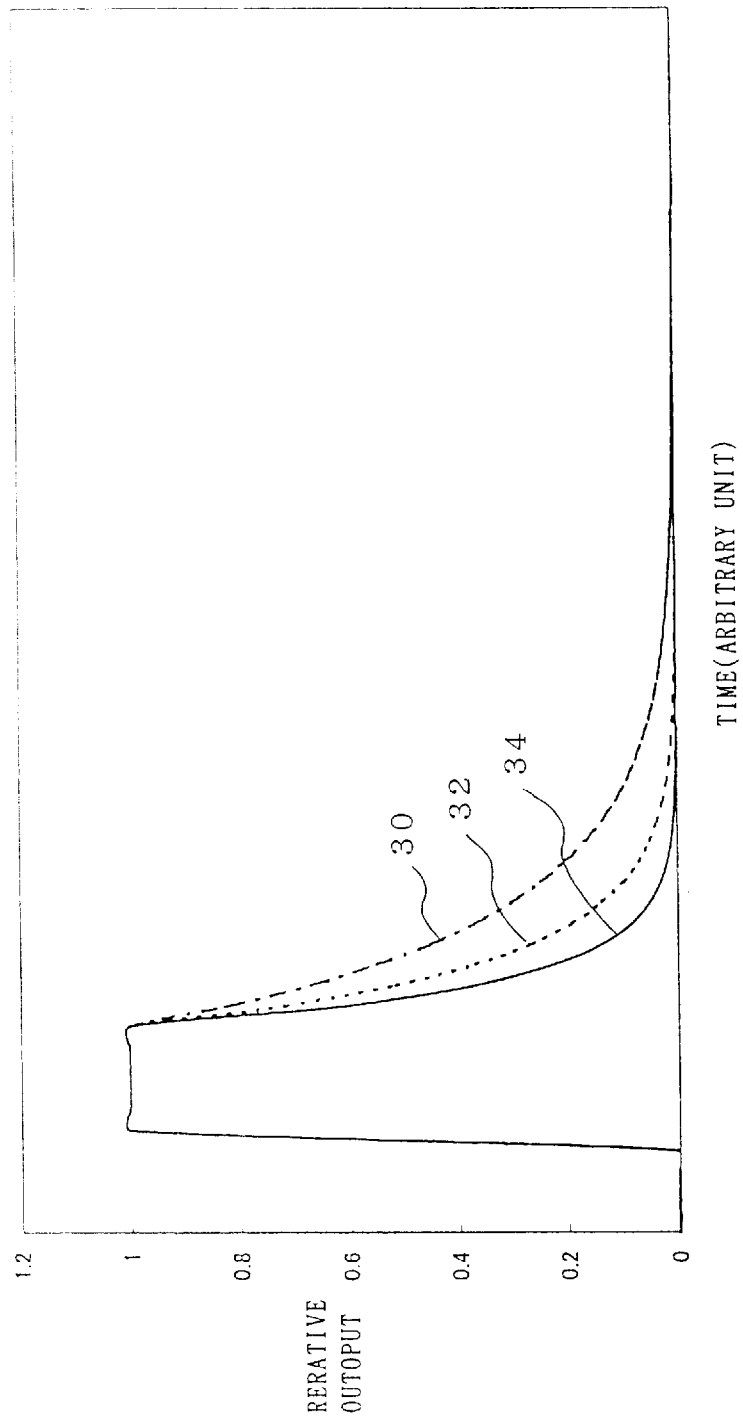
F I G. 6

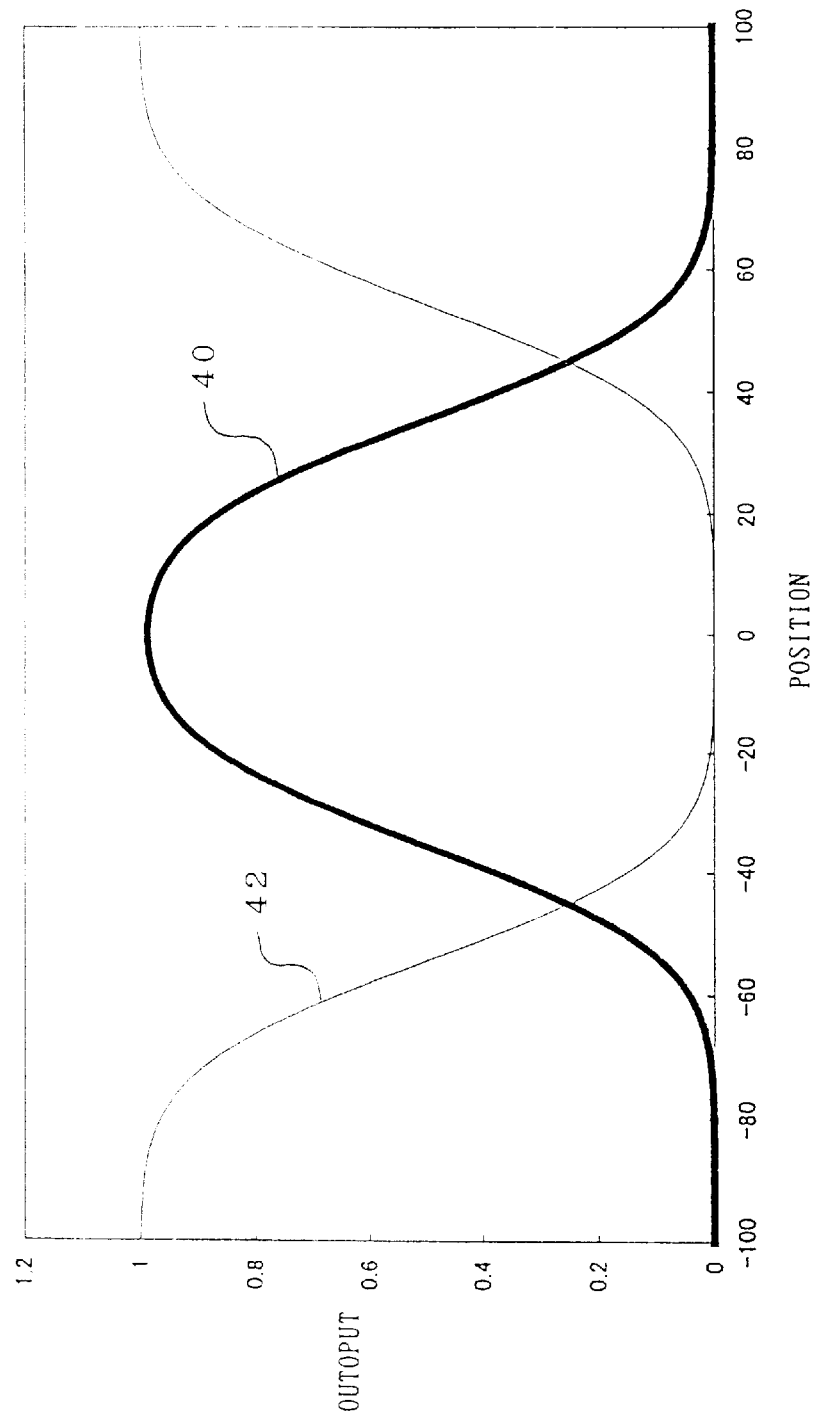
F I G. 9

US 6,507,084 B2

SEMICONDUCTOR LIGHT-RECEIVING ELEMENT

BACKGROUND OF THE INVENTION

1. Technical Field

The present invention relates to a semiconductor light-receiving element, particularly to a semiconductor light-receiving element fabricated by an impurity diffusion method.

2. Prior Art

A photodiode is generally used as one of photodetectors. A photodiode is fabricated by forming an N-type region in a P-type region of semiconductor and vice versa to form a PN junction. When light impinges upon the PN junction, free carriers (electron-hole pairs) are generated in the PN junction. The carrier are drifted to the P-type or N-type region through the electric field induced by space charge in the PN junction or the electric field intentionally applied between the P-type and N-type region. By the drift of the carriers, a current (or a voltage) is generated between P-type and N-type regions, so that the presence or strength of light may be sensed by monitoring the current. Furthermore, a PIN photodiode including a region of low impurity concentration formed between P-type and N-type regions has been fabricated for the purpose of a high sensitivity and high speed.

Compound semiconductors such as silicon, gallium arsenide, and the like have been broadly used as materials for a photodiode having a sensitive peak to visible light. Alternatively, Ge and InGaAs are used for sensing near infrared ray. A photodiode have generally the structure in which an impurity is diffused into one of the materials described above or into a part of the material epitaxialy grown said one of the material to form an island region having a conductivity type different from that of a substrate. Electrodes are formed on the top of impurity diffused region and the bottom of the substrate.

FIG. 1 shows a partially cutaway perspective view of a conventional photodiode, and FIG. 2 illustrates a plan view thereof. An impurity diffused region (or an active region) 10 formed in a substrate 8 is shown by a hatching area. An annular electrode 12 is formed on the top of the diffused region 10, and a flat electrode 6 is formed on the bottom of the substrate 8.

In this type of photodiode, if the active region 10 is small, then the light impinged upon the photodiode is spread outside the active region 10. As a result, it becomes difficult that all of the incident light is absorbed by the active region 10. The spread of the incident light outside the active region is considered due to the following reasons, for example;

(1) the convergence of light is insufficient,
(2) a part of light impinges upon the area outside the active region due to the shift of optical axis, and
(3) the light passing through the active region is reflected or scattered on the electrode provided on the bottom of the substrate and is absorbed in the area outside the active region.

The carriers generated in the active region are accelerated by reverse vias applied to the PN junction to cause a drift current. On the other hand, the carriers generated in the area outside the active region cause a diffusion current. The diffusion current has an influence on the output of the photodiode. That is, when a part of light is absorbed in the area outside the active region, the output of the photodiode with respect to the light input is decreased. Also, the carriers generated in the active region and then overflowed into the area outside the active region, and the carriers generated in the area outside the active region are diffused and recombinated in delayed. This causes the phenomenon such that the following-up to pulsed light is delayed, and then the photoelectric conversion for a high-speed digital signal may not be effectively performed. The phenomenon are generally referred to as "a slow tail phenomenon" in the output in a photodiode, resulting in bit errors.

In order to suppress the occurrence of such a slow tail phenomenon, the following methods are used, i.e. (1) a floating guard ring method, and (2) a method for shielding light by using a metal film and the like.

Referring to FIG. 3, according to the floating guard ring method, a floating guard ring 14 is provided in a region surrounding the active region 10. The floating guard ring 14 is formed by diffusing an impurity in a substrate in the same manner as the formation of the active region 10. Therefore, the floating guard ring also includes a PN junction. The internal electric field caused in the PN junction promotes the recombination of generated carriers to suppress the slow tail phenomenon.

Referring to FIG. 4, according to the latter method for shielding light, the area outside the active region 10 is covered by a light shielding film 16 in order to prevent light from impinging upon the area.

In the floating guard ring method, all of the carriers generated in the area outside the active region 10 and flew into the area are not necessarily recombined, because not only drift but also diffusion are operated in the floating guard ring.

The electric field between the active region 10 and the floating guard ring 14 is zero. Therefore, when light impinges upon between the active region 10 and the floating guard ring 14, the carriers generated therebetween migrate to the active region 10 or the floating guard ring 14 by diffusion. The carriers reached to the floating guard ring are not necessarily combinated therein as described above. Accordingly, the float guard ring method may not suppress enough the slow tail phenomenon.

The method for shielding light by using a metal film and the like is effective to the insufficiency of convergence of light and the optical misalignment, but is not effective to the reflection and scattering of light passing through the active region on the bottom electrode, and the overflow of carriers from the active region to the area outside the active region. In this manner, the light shielding film 16 may prevent light from impinging, but have no effect on the prevention for mutual diffusion of carriers between the active region and the area outside the active region.

When an optical fiber is coupled to the conventional photodiode, the optical fiber is aligned to the photodiode while outputting light from the optical fiber and monitoring the output of the photodiode. There are two methods for such alignment, i.e. one is a DC alignment method in which an optical fiber is aligned to a photodiode so that the output of the photodiode becomes maximum while outputting continuous light (DC light) the strength thereof does not varied from the optical fiber, and the other is an AC alignment method using AC light the strength thereof is varied periodically. The optimum alignment position obtained by the DC alignment method and that by the AC alignment method are sometimes different.

The carriers generated in the area outside the active region are diffused into the active region to contribute the output of a photodiode in the case of DC light, while in the case of AC light, the diffusion of carriers may not follow with the variation of the strength of AC light when the frequency thereof is high. Therefore, the output of the photodiode in the case of AC light is different from that in the case of DC light. Accordingly, the results of alignment are different in the DC alignment and AC alignment methods depending on the state of carriers generated in the area outside the active region.

SUMMARY OF THE INVENTION

An object of the present invention is to provide a semiconductor light-receiving element fabricated by using an impurity diffusion, in which a slow tail phenomenon caused in the processing of a digital signal may be suppressed.

Another object of the present invention is to provide a semiconductor light-receiving element in which when an optical fiber is coupled thereto, the optimum alignment position has no difference between a DC alignment and AC alignment.

The present invention provides a semiconductor light-receiving element, comprising:
  a substrate including a first impurity diffused region,
  a first electrode provided on the bottom of the substrate,
  a second electrode provided on the first impurity diffused region,
  a second impurity diffused region provided so as to surround the first impurity diffused region with leaving a certain space therebetween, and
  a third electrode provided on the second impurity diffused region,
  wherein a reverse vias is applied to a PN junction formed by the substrate and the second impurity diffused region.

The present invention provides a method for coupling an optical fiber with the semiconductor light-receiving element according to claim 1 or 2, comprising the steps of:
  shifting an end of the optical fiber with respect to the first impurity diffused region of the semiconductor light-receiving element while outputting light from the optical fiber,
  monitoring the outputs of the first and second impurity diffused regions, and
  determining optimum alignment position of the optical fiber with respect to the semiconductor light-receiving element, when the output of the first impurity diffused region is largest and the output of the second impurity diffused region is smallest.

BRIEF DESCRIPTION OF THE DRAWINGS

FIG. 6 is a graph illustrating the output of the photodiode shown in FIG. 5 in comparison with that of the conventional photodiodes.

FIG. 9 shows a graph illustrating the outputs from the active region and guard ring as a function of positions, when an optical fiber is coupled to the photodiode of the present invention.

DETAILED DESCRIPTION OF THE INVENTION

First Embodiment

Figure 1:
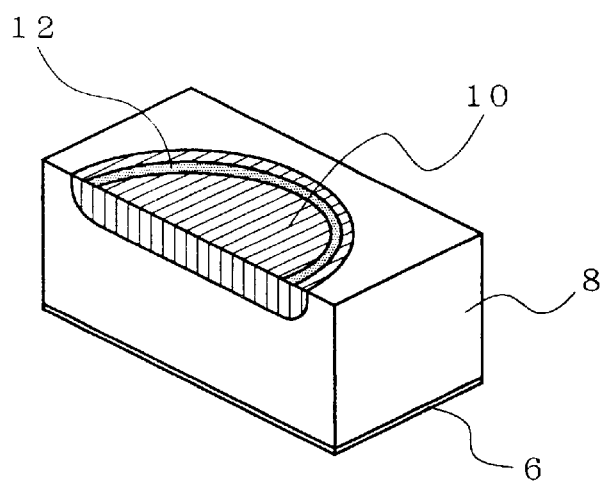
FIG. 1 is a partially cutaway perspective view of a conventional photodiode.
Figure 2:
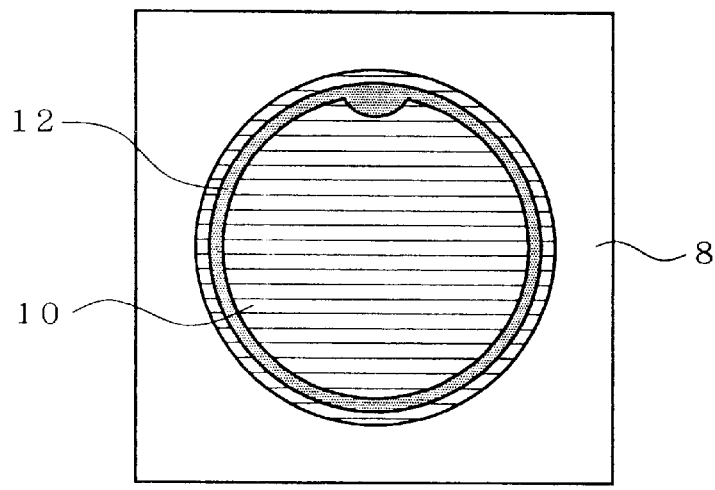
FIG. 2 is a plan view of a conventional photodiode.
Figure 5:
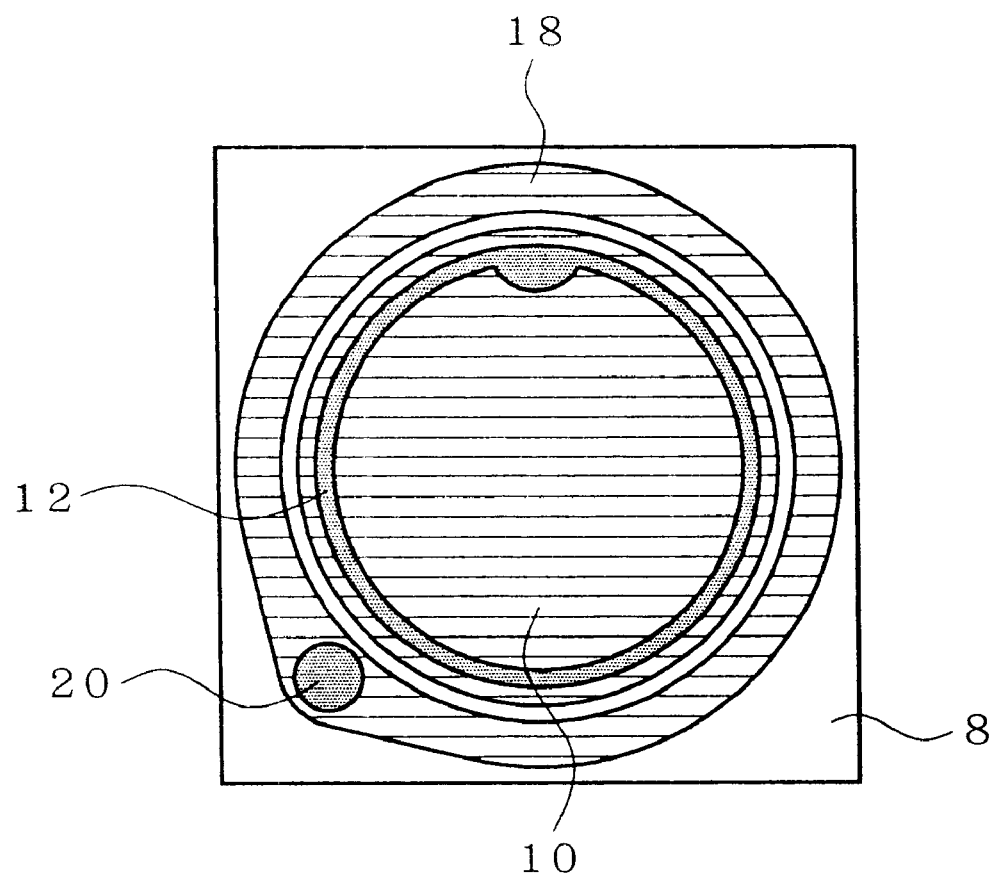
FIG. 5 is a plan view of a photodiode which is a first embodiment of a semiconductor light-receiving element according to the present invention.

FIG. 5 shows a plan view of a photodiode of a first embodiment according to the present invention. This photodiode further comprises an annular guard ring 18 surrounding the active region 10 in the conventional photodiode as shown in FIGS. 1 and 2. It should be noted that in the FIG. 5 like reference numerals are used for like elements in FIGS. 1 and 2.

The annular guard ring 18 is formed by an impurity diffused region, and a circular electrode 20 is provided thereon. In order to cause the guard ring 18 to be electrically independent of the active region 10, it is required to leave a certain space therebetween.

According to the structure described above, a PN junction surrounding the active region 10 is formed in the guard ring 18, and a reverse vias is applied to the PN junction by the electrode 20. As a result, it is possible that the carriers generated in the area outside the active region 10 is caused to be recombinated by not diffusion but draft. Therefore, a slow tail phenomenon may be largely decreased.

Figure 3:
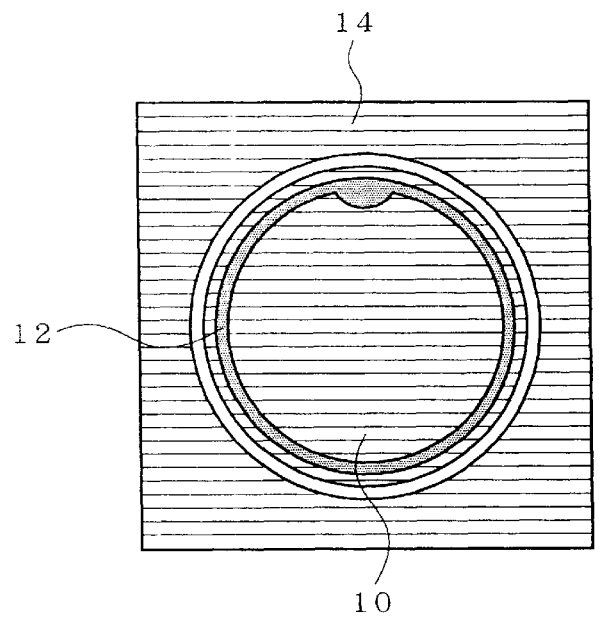
FIG. 3 is a plan view of a photodiode including a floating guard ring.
Figure 4:
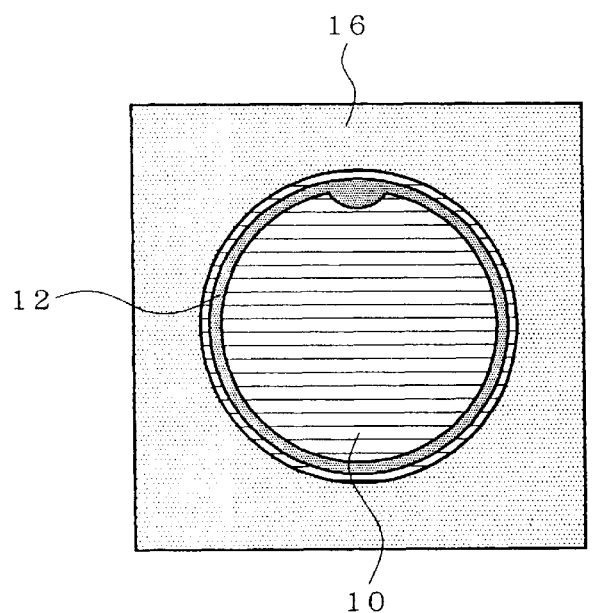
FIG. 4 is a plan view of a photodiode including a light shielding film.

FIG. 6 shows a graph illustrating the effect of the present embodiment. In the graph, an ordinate designates a relative output of the photodiode, and an abscissa denotes a time. A curve 30 shows a characteristic of the conventional photodiode shown in FIGS. 1 and 2, and a curve 32 that of the conventional photodiode according to the floating guard ring method shown in FIG. 3, and a curve 34 that of the photodiode of the present embodiment. As apparent from these curves, the conventional photodiode according to the floating guard ring method of the curve 32 decrease its slow tail to fractions of that of the conventional photodiode of the curve 30, and the photodiode of the present embodiment of the curve 34 further decrease its slow tail to more than one-half of that of the photodiode of the curve 32.

Second Embodiment

In the first embodiment illustrated in FIG. 5, a space more than a certain value between the active region and the guard ring is required to make the guard ring independent of the active region. Therefore, if light impinges upon an impurity non-diffused region between the active region and the guard ring, then a diffusion current flows in that region, resulting in a factor of a slow tail phenomenon.

In order to prevent light from impinging directly upon the non-diffused region, a light shielding film such as a metal film may be provided on the region. The photodiode including such light shielding film is illustrated in a plan view of FIG. 7. The photodiode is provided with a light shielding film 22 covering the non-diffused region between the active region 10 and guard ring 18, in the photodiode in FIG. 5.

According to the present embodiment, the factor of a slow tail phenomenon is eliminated in the photodiode in FIG. 5, so that the characteristic thereof may be further improved.

Third Embodiment

Figure 7:
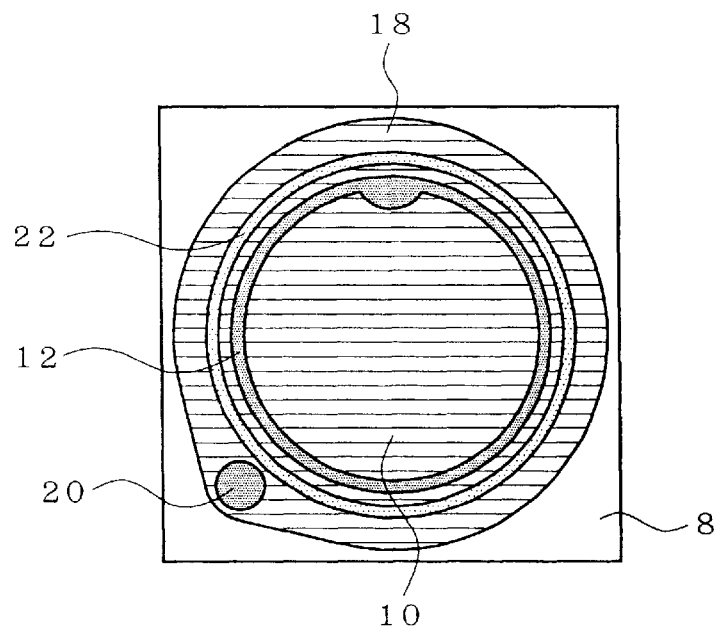
FIG. 7 is a plan view of a photodiode which is a second embodiment of a semiconductor light-receiving element according to the present invention.

In the second embodiment in FIG. 7, the light shielding film is provided only on the impurity non-diffused region between the active region 10 and the annular guard ring 18. Therefore, if light impinges upon an impurity non-diffused region outside the annular guard ring 18, then a diffusion current generated in the non-diffused region causes the factor of a slow tail phenomenon.

Figure 8:
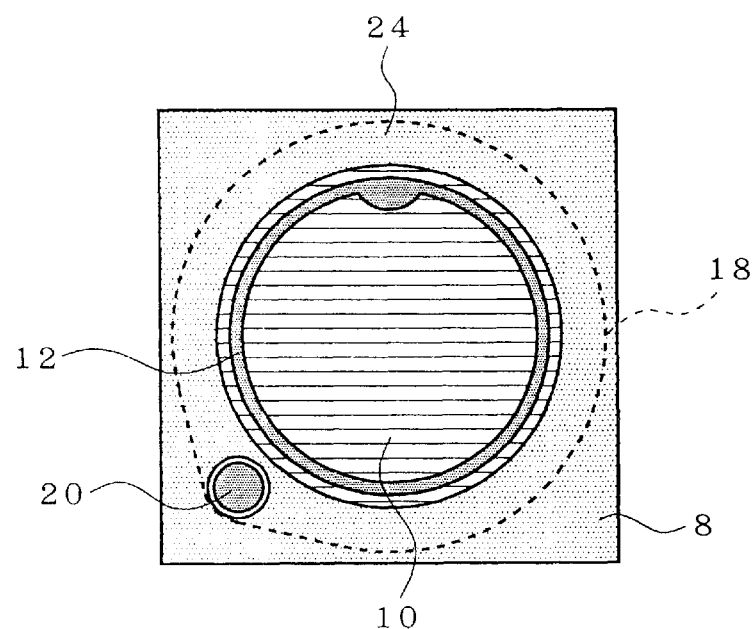
FIG. 8 is a plan view of a photodiode which is a third embodiment of a semiconductor light-receiving element according to the present invention.

Referring to FIG. 8, there is shown a photodiode of a third embodiment. In the third embodiment, a light shielding film 24 is provided not only on the impurity non-diffused region between the active region 10 and the annular guard ring 18 but also on the guard ring 18 except the electrode 20 and on the impurity non-diffused region outside the guard ring 18.

According to this embodiment, the problems of both the insufficiency of convergence of light and the optical misalignment may be solved by means of the light shielding film 24. Furthermore, the carriers are recombinated by drift in the guard ring region 18, the carriers being generated by the light passed through the active region 10 and then reflected or scattered on the bottom electrode, and being generated in the active region 10 and overflown outside thereof. Therefore, further improvement of the characteristic of the photodiode may be realized.

Fourth Embodiment

This embodiment is directed to a method for coupling an optical fiber and the diode of the first or second embodiment.

The annular guard ring 18 of the present invention works as an active region. Therefore, when an optical fiber is coupled with the photodiode, the optical fiber may be aligned with the photodiode by monitoring the outputs from both the active region 10 and the guard ring 18 while outputting light from the optical fiber. FIG. 9 shows a graph illustrating the outputs monitored. An ordinate designates the magnitude of the output, and an abscissa a position of the optical fiber with respect to the photodiode. The thick line 40 denotes the output of the active region 10, and the thin line the output of the guard ring 18.

When an end of the optical fiber is shifted with respect to the active region 10 the photodiode during alignment, the output of the active region 10 is increased while the output of the guard ring 18 is decreased, as the light outputted from the optical fiber gets near to the active region of the photodiode. Therefore, the alignment position to be targeted corresponds to that where the output of the guard ring 18 is smallest and the output of the active region 10 is largest.

According to this method, the alignment between the photodetector and the optical fiber becomes easier.

As the diffusion of carriers may be suppressed in the photodiode of the present invention, the carriers generated in the area outside the active region may be prevented from diffusing into the active region. Therefore, the difference may not be caused in the optimum alignment positions by the DC and AC alignments.

While particular embodiments of the present invention have been described herein for purpose of illustration, many modifications and changes will become apparent to those skilled in the art.

What is claimed is:

1. A planar semiconductor light-receiving element, comprising:

a substrate;

a first impurity diffused region provided in the substrate, a first electrode provided on a bottom surface of the substrate, a second electrode provided on the first impurity diffused region, a second impurity diffused region provided in the substrate so as to surround the first impurity diffused region, with leaving a certain space therebetween; and a third electrode provided on the second impurity diffused region, wherein a reverse bias is applied through the third electrode to a PN junction formed by the substrate and the second impurity diffused region, thereby causing carriers present outside the first impurity diffused region to recombine subject to a drift current, the carriers being generated by light impinging upon a top surface of the planar semiconductor light-receiving element.

2. The planar semiconductor light-receiving element according to claim 1, wherein a light shielding film is provided on an impurity non-diffused region between the first and second impurity diffused regions, thereby preventing light from impinging directly upon the impurity non-diffused region.

3. The planar semiconductor light-receiving element according to claim 1, wherein a light shielding film is provided on the top surface of the planar semiconductor light-receiving element except the first impurity diffused region and the third electrode, thereby preventing light from impinging directly upon an impurity non-diffused region outside the second impurity diffused region.

4. The planar semiconductor light-receiving element according to claim 2 or 3, wherein the light shielding film is a metal film.

5. The planar semiconductor light-receiving element according to claim 4, wherein the planar semiconductor light-receiving element is a planar photodiode.

* * * * *